United States Patent
Drost

(10) Patent No.: US 6,509,765 B1
(45) Date of Patent: Jan. 21, 2003

(54) SELECTABLE RESISTOR AND/OR DRIVER FOR AN INTEGRATED CIRCUIT WITH A LINEAR RESISTANCE

(75) Inventor: Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/990,729

(22) Filed: Nov. 20, 2001

(51) Int. Cl.[7] ................................................ H03K 3/00
(52) U.S. Cl. ......................... 327/112; 327/170; 326/87
(58) Field of Search ................................ 327/112, 111, 327/108, 170; 326/85, 87

(56) References Cited

U.S. PATENT DOCUMENTS 5,382,847 A * 1/1995 Yasuda ......................... 326/87
5,389,834 A * 2/1995 Kinugasa et al. ............. 326/87
6,351,149 B1 * 2/2002 Miyabe ........................ 326/87
6,356,102 B1 * 3/2002 Klein et al. ................... 326/87

* cited by examiner

Primary Examiner—Toan Tran
(74) Attorney, Agent, or Firm—Park, Vaughan & Fleming LLP

(57) ABSTRACT

One embodiment of the present invention provides resistor within an integrated circuit with a substantially linear resistance. This resistor includes a diode-connected transistor coupled in parallel with a current-source-connected transistor, so that a nonlinear resistance of the diode-connected transistor combines with a nonlinear resistance of the current-source-connected transistor to produce a substantially linear combined resistance. It also includes selection circuit that is configured to selectively deactivate the resistor by deactivating the diode-connected transistor and the current-source-connected transistor. This selection circuit provides a range of possible resistance values, and thus enables the resistance to be quickly switched on and off to allow for use in a high-speed driver circuit.

29 Claims, 8 Drawing Sheets

US 6,509,765 B1

SELECTABLE RESISTOR AND/OR DRIVER FOR AN INTEGRATED CIRCUIT WITH A LINEAR RESISTANCE

BACKGROUND

1. Field of the Invention

The present invention relates to integrated circuits. More specifically, the present invention relates to a method and an apparatus for providing a selectable resistor and/or driver for an integrated circuit that provides a substantially linear resistance.

2. Related Art

As computer system performance continues to increase at an exponential rate, communications between semiconductor chips that make up a computer system must take place at the fastest possible rate. Inter-chip communication speeds can be limited by noise caused by reflections on the signal lines between the chips. A reflection is typically caused by an impedance mismatch between the signal line and a receiver or a driver at an end of the signal line.

An impedance mismatch can be corrected by terminating the end of the signal line with one or more termination resistors. It is possible to use a transistor on a semiconductor chip as a termination resistor. However, transistors tend to have highly nonlinear impedance characteristics, which means that the impedance of a transistor changes as the voltage on the signal line changes. As this impedance changes, the transistor becomes less effective at eliminating reflections.

This nonlinearity problem can be rectified by using a current-source-connected transistor 204 in parallel with a diode-connected transistor 202 as is illustrated in FIG. 2A. Note that Vcsn is a current source reference voltage that can be used to vary to impedance of current-source connected transistor 204. By coupling current-source-connected transistor 204 in parallel with diode-connected transistor 202, a substantially linear impedance is produced as is illustrated by the graph showing I-V curves in FIG. 3. In FIG. 3, the impedance of a diode-connected transistor 302 is combined with the impedance of a current-source-connected transistor 304 to produce a combined resistance 306 that is substantially linear.

Unfortunately, the circuit illustrated in FIG. 2A has a number of shortcomings. Once the semiconductor chip is fabricated, the transistors are fixed in silicon. Hence, it is not possible to adjust the impedance of the circuit illustrated in FIG. 2A to adjust for different signal line impedances and to adjust for manufacturing process variations that can cause the impedance of the transistors to change. Moreover, the circuit illustrated in FIG. 2A is not practical for terminating a CMOS driver, because it always remains active. Hence, if the termination resistor is used to terminate the output of a driver to $V_{DD}$, the termination resistor continues to pull the output toward $V_{DD}$, even when the output is driven to a low voltage.

What is needed is an method and an apparatus for providing a linear termination resistance on a semiconductor chip without the above-described problems.

SUMMARY

One embodiment of the present invention provides resistor within an integrated circuit with a substantially linear resistance. This resistor includes a diode-connected transistor coupled in parallel with a current-source-connected transistor, so that a nonlinear resistance of the diode-connected transistor combines with a nonlinear resistance of the current-source-connected transistor to produce a substantially linear combined resistance. It also includes selection circuit that is configured to selectively deactivate the resistor by deactivating the diode-connected transistor and the current-source-connected transistor. This selection circuit provides a range of possible resistance values, and thus enables the resistance to be quickly switched on and off to allow for use in a high-speed driver circuit.

In a variation on this embodiment, the gate of the diode-connected transistor is coupled to the source of the diode-connected transistor when the diode-connected transistor is active.

In a variation on this embodiment, the gate of the current-source-connected transistor is coupled to a current source reference voltage when the current-source-connected transistor is active.

In a variation on this embodiment, the diode-connected transistor is an NMOS transistor with a source input coupled to ground, and the current-source-connected transistor is an NMOS transistor with a source input coupled to ground. In a further variation, the selection circuit is configured to deactivate the diode-connected transistor by coupling the gate of the diode-connected transistor to ground, and the selection circuit is configured to deactivate the current-source-connected transistor by coupling the gate of the current-source-connected transistor to ground.

In a variation on this embodiment, the diode-connected transistor is a PMOS transistor with a source input coupled to $V_{DD}$, and the current-source-connected transistor is a PMOS transistor with a source input coupled to $V_{DD}$. In a further variation, the selection circuit is configured to deactivate the diode-connected transistor by coupling the gate of the diode-connected transistor to $V_{DD}$, and the selection circuit is configured to deactivate the current-source-connected transistor by coupling the gate of the current-source-connected transistor to $V_{DD}$.

In a variation on this embodiment, the selection circuit is controlled by a selection signal.

In a variation on this embodiment, the resistor includes a fixed linear resistance, which is not affected by the selection circuit, coupled in parallel with the diode-connected transistor and the current-source-connected transistor. This fixed linear resistance includes, a second diode-connected transistor, and a second current-source-connected transistor coupled in parallel with the second diode-connected transistor.

One embodiment of the present invention provides a driver circuit with a substantially linear resistance. This driver circuit includes an input that receives an input signal and an output. It also includes a pullup circuit that pulls the output to $V_{DD}$. This pullup circuit includes a diode-connected PMOS transistor and a current-source-connected PMOS transistor coupled in parallel with the diode-connected PMOS transistor, so that a nonlinear resistance of the diode-connected PMOS transistor combines with a nonlinear resistance of the current-source-connected PMOS transistor to produce a substantially linear combined resistance. The driver circuit also includes a pulldown circuit that pulls the output to ground. This pulldown circuit includes, a diode-connected NMOS transistor and a current-source-connected NMOS transistor coupled in parallel with the diode-connected NMOS transistor so that a nonlinear resistance of the diode-connected NMOS transistor combines with a nonlinear resistance of the current-source-connected NMOS transistor to produce a substantially linear combined resistance. The driver circuit also includes a selection circuit that is configured to activate the pullup circuit and deactivate the pulldown circuit when the input signal exceeds a threshold voltage. The selection circuit is also configured to deactivate the pullup circuit and activate the pulldown circuit when the input signal falls below the threshold voltage.

In a variation on this embodiment, the selection circuit additionally receives a pullup select signal and a pulldown select signal. The selection circuit is configured to enable the pullup circuit when the pullup select signal is asserted, and to enable the pulldown circuit when the pulldown select signal is asserted.

One embodiment of the present invention provides a driver circuit with a substantially linear resistance. A set of selectable pullup circuits are configured to pull the output of the driver circuit to $V_{DD}$. Each selectable pullup circuit includes, a diode-connected PMOS transistor and a current-source-connected PMOS transistor coupled in parallel with the diode-connected PMOS transistor so that a nonlinear resistance of the diode-connected PMOS transistor combines with a nonlinear resistance of the current-source-connected PMOS transistor to produce a substantially linear combined resistance. Each selectable pullup circuit also includes a pullup selection circuit for enabling the selectable pullup circuit in response to a pullup selection signal. A set of selectable pullup circuits are configured to pull the output of the driver circuit to ground. Each selectable pullup circuit includes, a diode-connected NMOS transistor and a current-source-connected NMOS transistor coupled in parallel with the diode-connected NMOS transistor so that a nonlinear resistance of the diode-connected NMOS transistor combines with a nonlinear resistance of the current-source-connected NMOS transistor to produce a substantially linear combined resistance. Each selectable pulldown circuit also includes a pulldown selection circuit for enabling the selectable pulldown circuit in response to a pulldown selection signal. In this embodiment, the selectable pulldown circuits and the selectable pullup circuits are independently selectable, so that the driver circuit can be configured to use a selectable number of pullup circuits and a selectable number of pulldown circuits.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Driver Circuit

Figure 1:
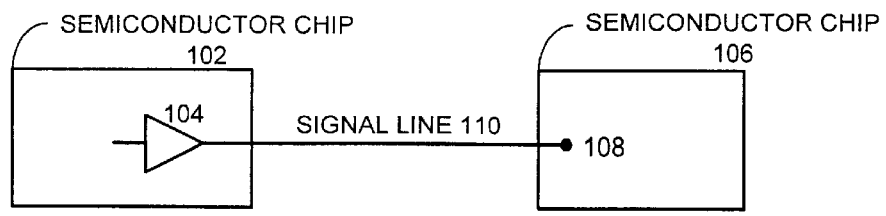
FIG. 1 illustrates a driver for communicating between semiconductor chips in accordance with an embodiment of the present invention.

FIG. 1 illustrates a driver circuit 104 for communicating between semiconductor chip 102 and semiconductor chip 106 in accordance with an embodiment of the present invention. Driver circuit 104 within semiconductor chip 102 is configured to drive signal line 110, which carries a signal to semiconductor chip 106. If the end 108 of signal line 110 is not terminated properly, it can cause a reflection back to driver 104. If driver circuit 104 is not terminated properly, it can cause a reflection of the reflected signal. These reflections can lead to "ringing" on signal line 110.

Selectable NMOS Linear Transistor Resistance

Figure 2A:
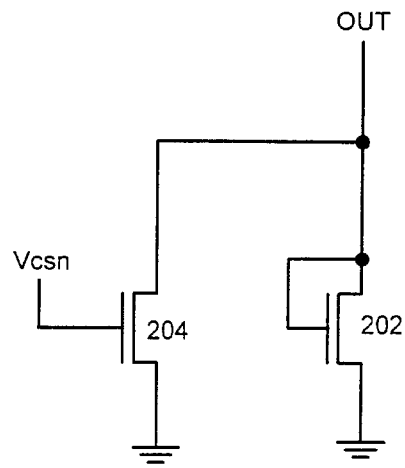
FIG. 2A illustrates a linear resistor made from NMOS transistors.
Figure 2B:
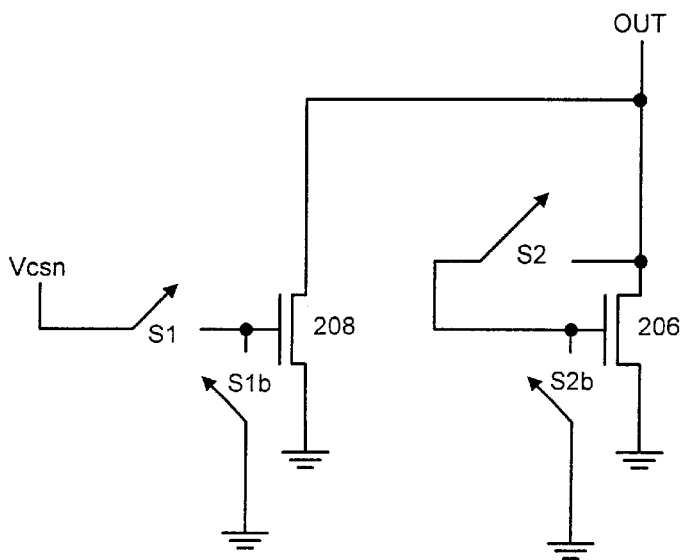
FIG. 2B illustrates a switchable linear resistor made from NMOS transistors in accordance with an embodiment of the present invention.

FIG. 2B illustrates a switched linearized transistor resistance in accordance with an embodiment of the present invention. This circuit contains a currentsource-connected transistor 208 and a diode-connected transistor 206. When current-source-connected transistor 208 has the voltage Vcsn applied to its gate, it sinks a constant current from the output node for output voltage values of roughly Vout>Vcsn−Vtn (where Vtn is the threshold voltage of the NMOS transistor). When the diode-connected transistor 206 has its gate connected to its drain, transistor 206 behaves like a diode with respect to its current sinking function.

The circuit illustrated in FIG. 2B provides these gate voltages when switches S1 and S2 are conducting, and when switches S1b and S2b are blocking. Note that the Vcsn voltage can be created to provide a desired output current, or can be connected to a chip supply such as Vdd.

Figure 3:
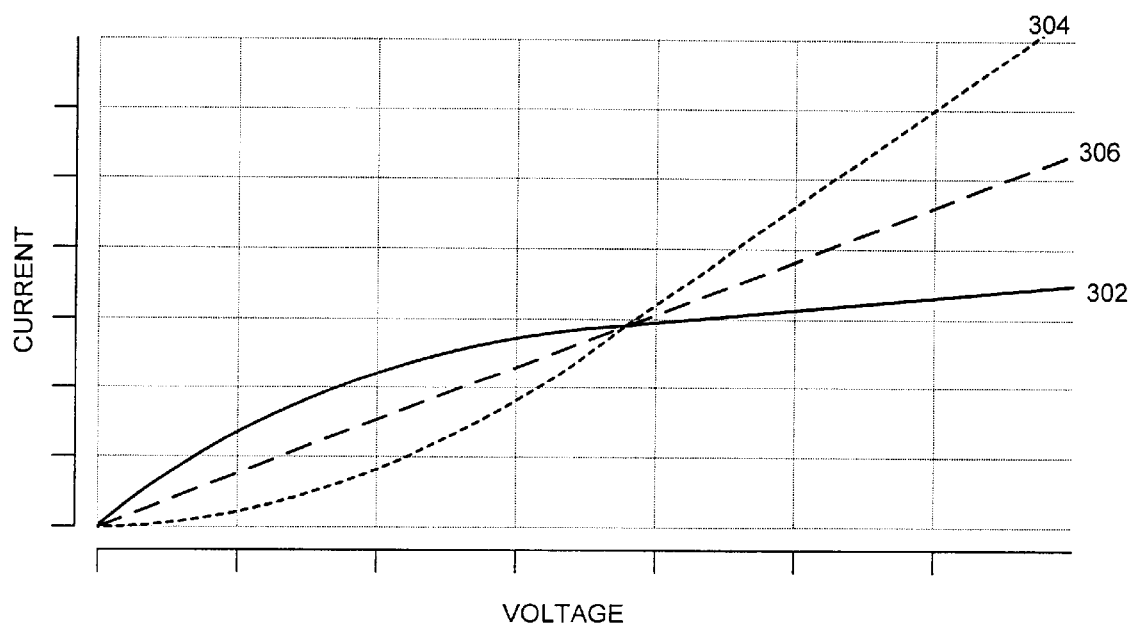
FIG. 3 illustrates how nonlinear transistors can be combined to make a linear resistor.

FIG. 3 illustrates current versus voltage (I-V) curves for a current-source-connected NMOS transistor 302, a diode-connected NMOS transistor 304 and for their sum 306. The x-axis shows the Out voltages of the circuit, the y-axis shows the current sunk by the circuit. As can be seen in FIG. 3, the transistors individually have nonlinear resistances.

However, the nonlinearity error in the current-source-connected transistor and the diode-connected transistor have approximately equal and opposite magnitudes. Consequently, the sum 306 of the transistor currents 302 and 304 provides a much more linear I-V current, and hence a linearized resistance.

Switches

Figure 4:
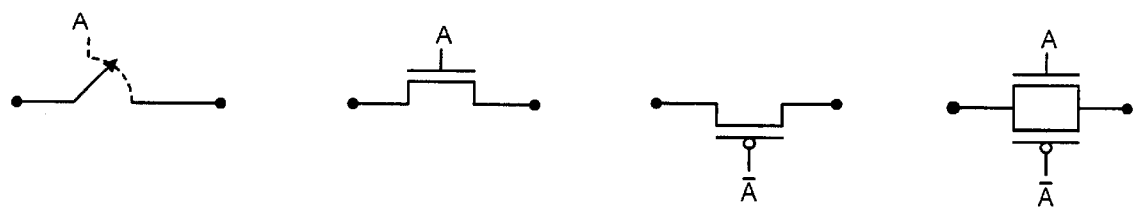
FIG. 4 illustrates various implementations of a switch in accordance with an embodiment of the present invention.

FIG. 4 illustrates possible implementations of the switches, S1, S2, S1b and S2b illustrated in FIG. 2B in accordance with an embodiment of the present invention. Referring to FIG. 4B, the NMOS switch is appropriate for output voltages near to ground, the PMOS switch is appropriate for output voltages near to Vdd, and the complementary combination of the NMOS and PMOS creates a complementary switch that works for all output voltages.

An advantage of the switched circuit illustrated in FIG. 2B is that transistors 206 and 208 can be turned off (tri-stated) when switches S1b and S2b are conducting and switches S1 and S2 are blocking. Note that the circuit illustrated in FIG. 2B can be duplicated with the Out terminals of the duplicated circuits connected together. Thus, by selecting the states of the switches in the duplicated circuits, a range of resistance values are achievable. This is useful in compensating for a fabrication technology that has uncertain transistor properties.

Additionally, the switches can operate at high speeds, which enables the switched circuit to be used in an output driver that drives an output pin of a chip. If the output driver requires the switched resistance to also be selectable (to accommodate a variety of output resistances and to accommodate variation in fabrication properties), then the switches can implement an AND logic function on the enable and input values.

Figure 5:
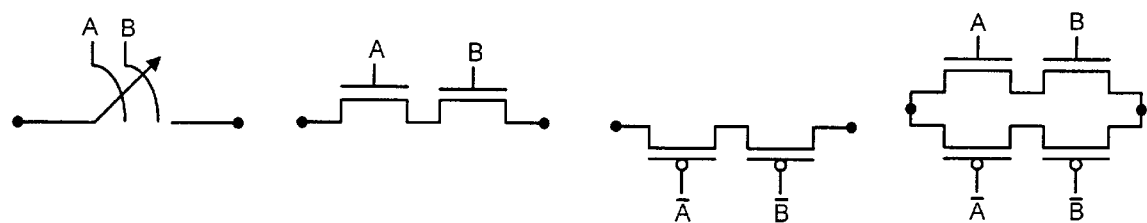
FIG. 5 illustrates various implementations of a switch with two control inputs in accordance with an embodiment of the present invention.
Figure 5:
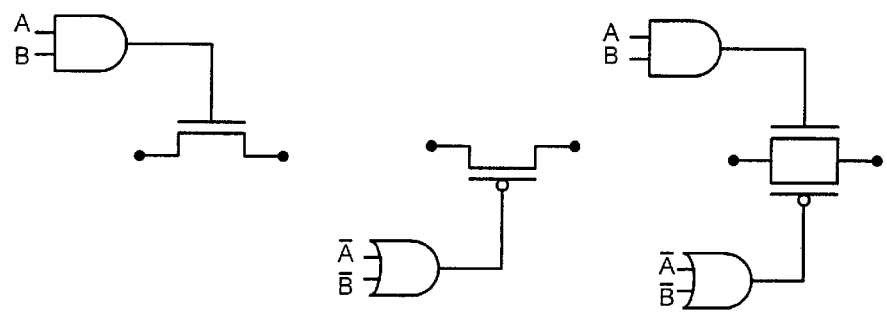

FIG. 5 illustrates possible implementations for a switch with two control inputs. The series transistor versions (top three) require fewer transistors and have lower latency, but add more capacitance to the output node as compared with the logic gate versions (bottom three).

Note that the switches illustrated in FIG. 5 can easily be extended to a three or more control inputs by adding additional series NMOS or PMOS transistors, or by widening the NAND or NOR gates to accommodate the additional control inputs.

Also note that the number of enabled current source-connected transistors may be different from the number of enabled diode-connected transistors.

Furthermore, note that the ideal ratio of the size of the current-source-connected transistor to the size of the diode-connected transistor can vary depending on the transistor's I-V curve, the Vcsn or Vcsp voltage used, and the voltage range over which the resistance is to be linearized. To produce the I-V curves shown in FIG. 3, the diode-connected transistor is about twice the width of the current-source connected transistor.

Note that diode-connected transistors and current-source-connected transistors can have separately controlled switches. This allows the number of diode-connected transistors and the number of current-source connected transistors to be varied to correct for fabrication variations in transistor I-V curves, for different Vcsn or Vcsp voltages, and for different voltage ranges over which to linearize the resistance.

Note that a fixed linear resistance and a number of switched linear resistances can be coupled at their Out nodes. The fixed linear resistance provides the minimum transistor sizes that may be needed. This allows switched linear resistances to be selectively added to correct for process variations in transistor properties, and to adjust for different desired resistance values.

Figure 6A:
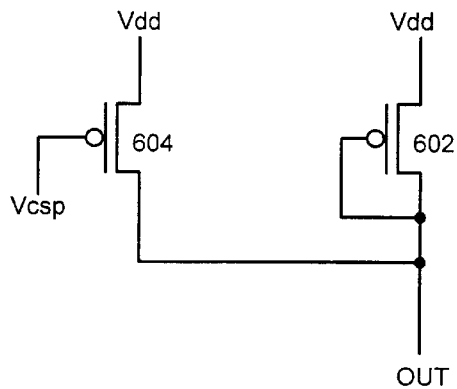
FIG. 6A illustrates a linear resistor made from PMOS transistors.
Figure 6B:
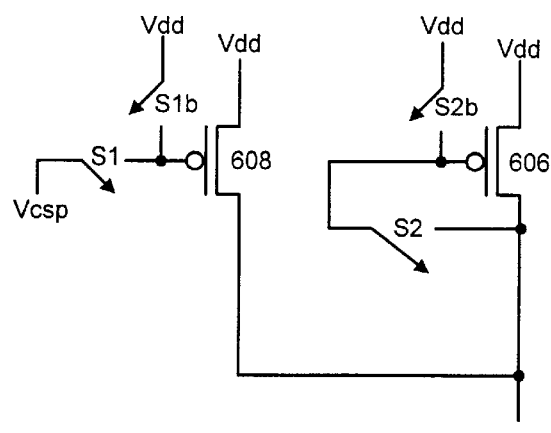
FIG. 6B illustrates a switchable linear resistor made from PMOS transistors in accordance with an embodiment of the present invention.

FIGS. 6A and 6B illustrate the PMOS versions of the linearized resistance circuit element. This PMOS versions are similar in operation and features to the NMOS versions, except that the control voltage is Vcsp rather than Vcsn, and the source terminals of the transistors connect to Vdd rather than ground. Another difference is that the PMOS versions of the circuit source, rather than sink, an output current.

Output Driver

Figure 7:
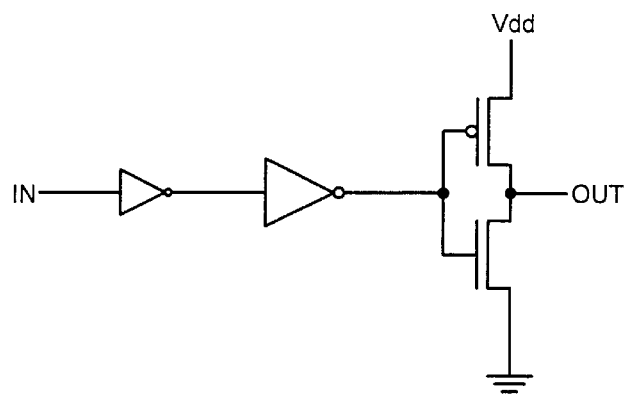
FIG. 7 illustrates a conventional driver circuit.

FIG. 7 illustrates a conventional output driver circuit. This conventional output driver circuit includes of inverters of successively increasing size. The expanded view the final inverter in FIG. 7 shows that the conventional output driver connects a PMOS transistor with a gate voltage of ground and a NMOS transistor with a gate voltage of Vdd to the output node. Thus, the conventional output driver includes output elements comparable to the current-source-connected transistors 208 and 608 from FIGS. 2B and 6B, respectively, with Vcsn coupled to Vdd and Vcsp coupled to ground.

Figure 8:
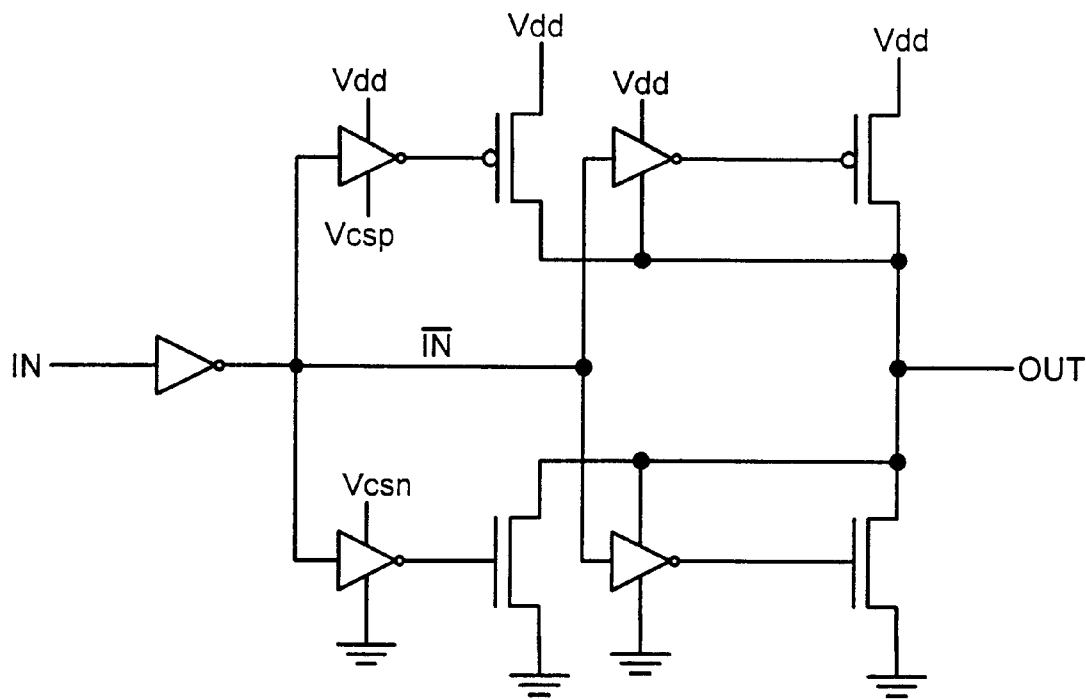
FIG. 8 illustrates a driver circuit that provides linear resistance in accordance with an embodiment of the present invention.

FIG. 8 illustrates an output driver using the linearized output resistance circuits from FIGS. 2B and 6B in accordance with an embodiment of the present invention. This output driver uses just one PMOS or NMOS transistor to implement each switch. FIGS. 4 and 5 show alternative switches that can used. For exarnple, a complementary switch can replace the NMOS and PMOS half-circuit's S2 switches. This makes the diode-connected transistor's gate voltage track the diode-connected transistor's drain voltage for a wider range of Out voltages. However, complementary switches add additional circuitry and can increase the capacitance on the output node.

Note that if Vcsp is set to ground and Vcsn is set to Vdd, the two inverters driving the gates of the current-source connected transistors can be replaced by an inverter coupled to Vdd on its positive terminal and ground on its negative terminal.

Figure 9:
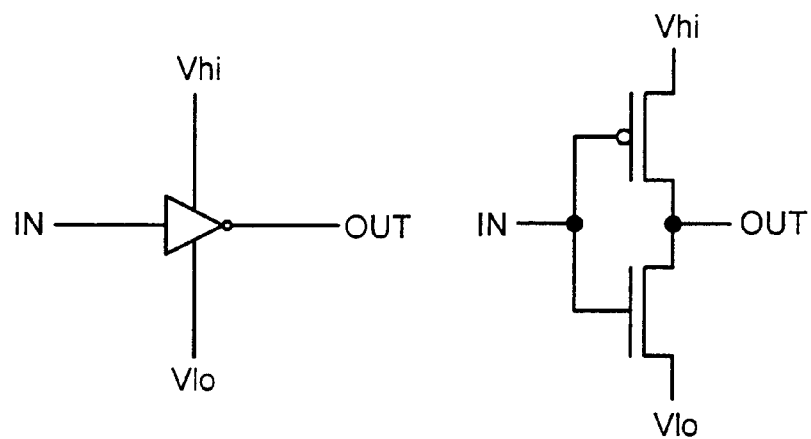
FIG. 9 illustrates a four-input inverter circuit in accordance with an embodiment of the present invention.

FIG. 9 illustrates the internal circuitry of a four terminal inverter that is used by the new output driver. It is a standard CMOS inverter except that positive and negative terminals are added. In a normal inverter, the positive terminal connects to Vdd and the negative terminal connects to ground.

Figure 10:
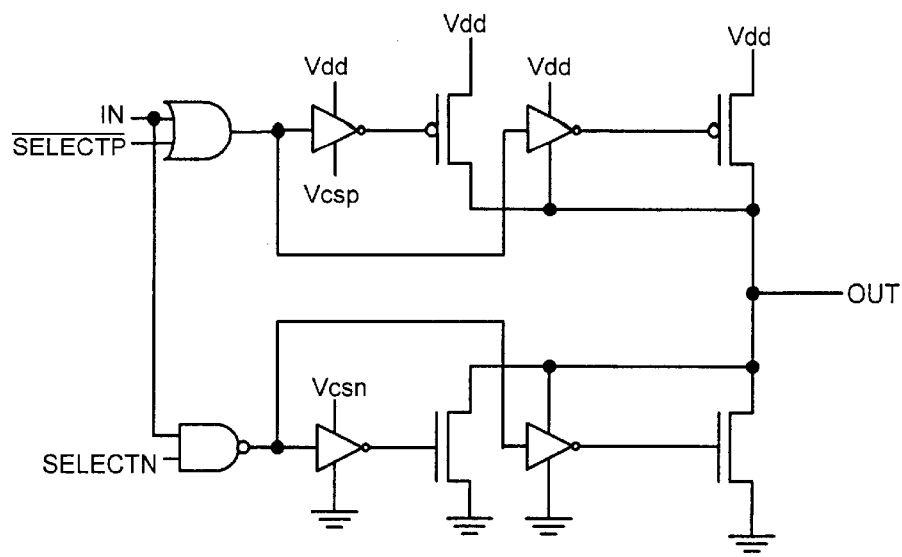
FIG. 10 illustrates a selectable driver circuit that provides linear resistance in accordance with an embodiment of the present invention.
Figure 12:
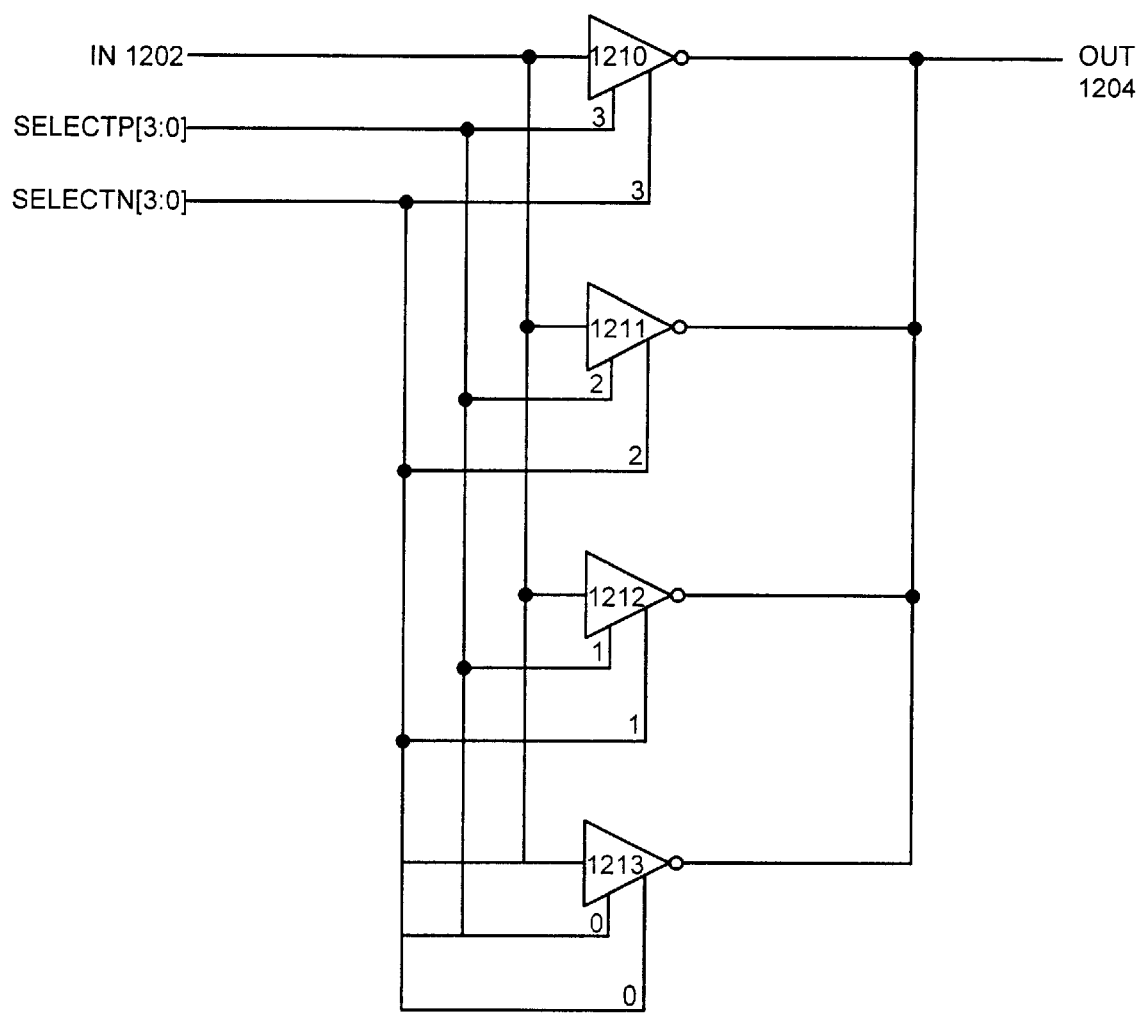
FIG. 12 illustrates a selectable driver circuit that provides linear resistance and is made up of multiple pullup circuits and multiple pulldown circuits in accordance with an embodiment of the present invention.

FIG. 10 illustrates a selectable version of the output driver in FIG. 8 in accordance with an embodiment of the present invention. Note that a number of these selectable output drivers can be combined, with their all of their In terminals coupled together, and all of their Out coupled together to construct an output driver with an adjustable output resistance as is illustrated in FIG. 12. In FIG. 12, the selectp and selection signals can be separately selected to modify the PMOS resistance separately from the NMOS resistance to compensate for fabrication variations in transistor strengths.

Figure 11:
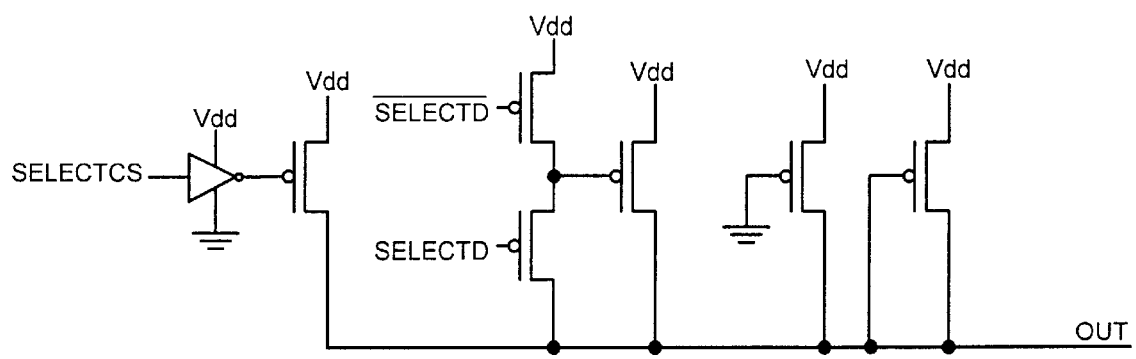
FIG. 11 illustrates an adjustable resistor that provides linear resistance in accordance with an embodiment of the present invention.

FIG. 11 illustrates a termination resistance circuit that terminates the Out node to Vdd in accordance with an embodiment of the present invention. If the termination resistance is supposed to connect to ground, then a NMOS version of the circuit is used. This circuit includes a fixed linearized resistance coupled in parallel to a number of selectable linearized resistances. The linearized resistances use ground for Vcsp. The fixed resistance is sized to provide the maximum resistance desired. Thus, by enabling various quantities of selectable circuits, the system provides a range of lower resistances.

The select switch that connects the diode-connected transistor's gate to drain is a PMOS transistor in this case. A PMOS transistor is appropriate for the switch if the Out voltage is constrained to be close to Vdd. If the Out voltage also approaches ground, then the switch's PMOS transistor should be augmented with an NMOS transistor to make the switch complementary.

An NMOS version of the termination resistor is similar, except that Vdd and ground are swapped (except for the inverter connections), with all of the PMOS transistors replaced with NMOS transistors, and with the select signals having opposite polarity.

Figure 13:
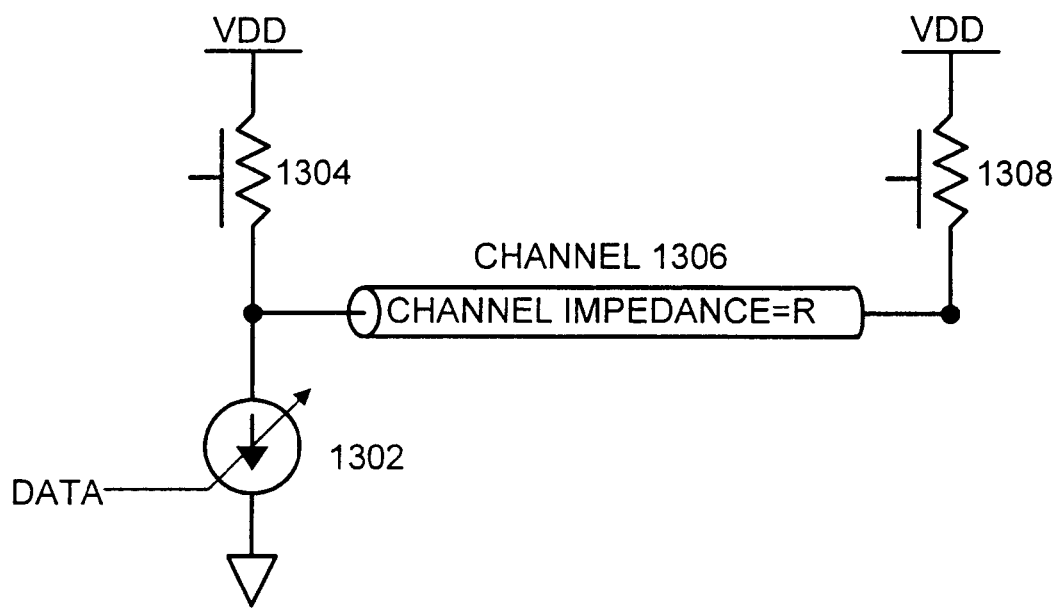
FIG. 13 illustrates how a terminated driver can be used for communicating between semiconductor chips in accordance with an embodiment of the present invention.

FIG. 13 illustrates a circuit using the linearized termination resistance illustrated in FIG. 12 in accordance with an embodiment of the present invention. The left side of the channel is coupled to a current-mode output driver 1302, which generates an output signal by producing an output current of 0 or 1. The left side of channel 1306 is coupled to a linearized termination resistance 1304 that has its selection signals set so that its resistance equals the channel impedance R. The right side of channel 1306 can optionally be terminated through termination resistance 1308 to improve the signal fidelity as is illustrated in FIG. 13. Also, note that by connecting a PMOS linearized resistance in series with an NMOS linearized resistance from Vdd to ground, a linearized on-chip voltage divider can be formed. Additionally, the adjustable linearized resistors can be used by other on-chip circuits that require a linear resistor.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A selectable resistor within an integrated circuit that provides a substantially linear resistance, comprising:
   a diode-connected transistor;
   a current-source-connected transistor coupled in parallel with the diode-connected transistor so that a nonlinear resistance of the diode-connected transistor combines with a nonlinear resistance of the current-source-connected transistor to produce a substantially linear combined resistance;
   a selection circuit configured to selectively deactivate the selectable resistor by deactivating the diode-connection transistor and the current-source-connected transistor; and
   a fixed linear resistance coupled in parallel with the diode-connected transistor and the current-source-connected transistor;
   wherein the fixed linear resistance includes,
      a second diode-connected transistor, and
      a second current-source-connected transistor coupled in parallel with the second diode-connected transistor; and
   wherein the fixed linear resistance is not affected by the selection circuit.

2. The selectable resistor of claim 1, wherein the gate of the diode-connected transistor is coupled to the source of the diode-connected transistor when the diode-connected transistor is active.

3. The selectable resistor of claim 1, wherein the gate of the current-source-connected transistor is coupled to a current source reference voltage when the current-source-connected transistor is active.

4. The selectable resistor of claim 1,
   wherein the diode-connected transistor is an NMOS transistor with a source input coupled to ground; and
   wherein the current-source-connected transistor is an NMOS transistor with a source input coupled to ground.

5. The selectable resistor of claim 4,
   wherein the selection circuit is configured to deactivate the diode-connected transistor by coupling the gate of the diode-connected transistor to ground;
   wherein the selection circuit is configured to deactivate the current-source-connected transistor by coupling the gate of the current-source-connected transistor to ground.

6. The selectable resistor of claim 1,
   wherein the diode-connected transistor is a PMOS transistor with a source input coupled to $V_{DD}$; and
   wherein the current-source-connected transistor is a PMOS transistor with a source input coupled to $V_{DD}$.

7. The selectable resistor of claim 6,
   wherein the selection circuit is configured to deactivate the diode-connected transistor by coupling the gate of the diode-connected transistor to $V_{DD}$; and
   wherein the selection circuit is configured to deactivate the current-source-connected transistor by coupling the gate of the current-source-connected transistor to $V_{DD}$.

8. The selectable resistor of claim 1, wherein the selection circuit is controlled by a selection signal.

9. A driver circuit that provides a substantially linear resistance, comprising:
   an input that receives an input signal;
   an output that provides an output signal derived from the input signal;
   a pullup circuit that pulls the output to $V_{DD}$, wherein the pullup circuit includes,
      a diode-connected PMOS transistor,
      a current-source-connected PMOS transistor coupled in parallel with the diode-connected PMOS transistor so that a nonlinear resistance of the diode-connected PMOS transistor combines with a nonlinear resistance of the current-source-connected PMOS transistor to produce a substantially linear combined resistance;
   a pulldown circuit that pulls the output to ground, wherein the pullup circuit includes,
      a diode-connected NMOS transistor,
      a current-source-connected NMOS transistor coupled in parallel with the diode-connected NMOS transistor so that a nonlinear resistance of the diode-connected NMOS transistor combines with a nonlinear resistance of the current-source-connected NMOS transistor to produce a substantially linear combined resistance;
   a selection circuit that is configured to,
      activate the pullup circuit and deactivate the pulldown circuit when the input signal exceeds a threshold voltage, and to
      deactivate the pullup circuit and activate the pulldown circuit when the input signal falls below the threshold voltage; and
   a fixed linear resistance coupled in parallel with the pullup circuit and the pulldown circuit;
   wherein the fixed linear resistance is not affected by the selection circuit.

10. The driver circuit of claim 9,
wherein the gate of the diode-connected NMOS transistor and the source of the diode-connected NMOS transistor are coupled to the output when the diode-connected NMOS transistor is active; and wherein the gate of the diode-connected PMOS transistor and the source of the diode-connected PMOS transistor are coupled to the output when the diode-connected PMOS transistor is active.

11. The driver circuit of claim 9,
wherein the gate of the current-source-connected NMOS transistor is coupled to a first current source reference voltage when the current-source-connected NMOS transistor is active; and wherein the gate of the current-source-connected PMOS transistor is coupled to a second current source reference voltage when the current-source-connected PMOS transistor is active.

12. The driver circuit of claim 9,
wherein the source of the diode-connected NMOS transistor is coupled to ground;

wherein the source of the current- source-connected NMOS transistor is coupled to ground;

wherein the source of the diode-connected PMOS transistor is coupled to $V_{DD}$; and wherein the source of the current-source-connected PMOS transistor is coupled to $V_{DD}$.

13. The driver circuit of claim 12,
wherein the selection circuit is configured to deactivate the diode-connected NMOS transistor by coupling the gate of the diode-connected NMOS transistor to ground;

wherein the selection circuit is configured to deactivate the current-source-connected NMOS transistor by coupling the gate of the current-source-connected NMOS transistor to ground;

wherein the selection circuit is configured to deactivate the diode-connected PMOS transistor by coupling the gate of the diode-connected PMOS transistor to $V_{DD}$; and wherein the selection circuit is configured to deactivate the current-source-connected PMOS transistor by coupling the gate of the current-source-connected PMOS transistor to $V_{DD}$.

14. The driver circuit of claim 9, wherein the selection circuit additionally receives a pullup select signal and a pulldown select signal;
wherein the selection circuit is configured to enable the pullup circuit when the pullup select signal is asserted; and wherein the selection circuit is configured to enable the pulldown circuit when the pulldown select signal is asserted.

15. A driver circuit that provides a substantially linear resistance, comprising:
an input that receives an input signal;
an output that provides an output signal derived from the input signal;
a set of selectable pullup circuits that pull the output to $V_{DD}$, wherein each selectable pullup circuit includes,
a diode-connected PMOS transistor,
a current-source-connected PMOS transistor coupled in parallel with the diode-connected PMOS transistor so that a nonlinear resistance of the diode-connected PMOS transistor combines with a nonlinear resistance of the current-source-connected PMOS transistor to produce a substantially linear combined resistance, and a pullup selection circuit for enabling the selectable pullup circuit in response to a pullup selection signal;

a set of selectable pulldown circuits that pull the output to ground, wherein each selectable pulldown circuit includes,
a diode-connected NMOS transistor,
a current-source-connected NMOS transistor coupled in parallel with the diode-connected NMOS transistor so that a nonlinear resistance of the diode-connected NMOS transistor combines with a nonlinear resistance of the current-source-connected NMOS transistor to produce a substantially linear combined resistance, a pulldown selection circuit for enabling the selectable pulldown circuit in response to a pulldown selection signal; and wherein the selectable pulldown circuits and the selectable pullup circuits are independently selectable, so that the driver circuit can be configured to use a selectable number of pullup circuits and a selectable number of pulldown circuits.

16. The driver circuit of claim 15,
wherein for a given selectable pulldown circuit, the gate of the diode-connected NMOS transistor and the source of the diode-connected NMOS transistor are coupled to the output when the diode-connected NMOS transistor is active; and wherein for a given selectable pullup circuit, the gate of the diode-connected PMOS transistor and the source of the diode-connected PMOS transistor are coupled to the output when the diode-connected PMOS transistor is active.

17. The driver circuit of claim 15,
wherein for a given selectable pulldown circuit, the gate of the current-source-connected NMOS transistor is coupled to a first current source reference voltage when the current-source-connected NMOS transistor is active; and wherein for a given selectable pullup circuit, the gate of the current-source-connected PMOS transistor is coupled to a second current source reference voltage when the current-source-connected PMOS transistor is active.

18. The driver circuit of claim 15,
wherein for a given selectable pulldown circuit, the source of the diode-connected NMOS transistor and the source of the current-source-connected NMOS transistor are coupled to ground;

wherein for a given selectable pullup circuit, the source of the diode-connected PMOS and the source of the current-source-connected PMOS transistor are coupled to $V_{DD}$.

19. The driver circuit of claim 15,
wherein for a given selectable pulldown circuit, the pulldown selection circuit is configured to,
deactivate the diode-connected NMOS transistor by coupling the gate of the diode-connected NMOS transistor to ground, and to deactivate the current-source-connected NMOS transistor by coupling the gate of the current-source-connected NMOS transistor to ground; and wherein for a given selectable pullup circuit, the pullup selection circuit is configured to, deactivate the diode-connected PMOS transistor by coupling the gate of the diode-connected PMOS transistor to $V_{DD}$, and to deactivate the current-source-connected PMOS transistor by coupling the gate of the current-source-connected PMOS transistor to $V_{DD}$.

20. A method for activating a selectable resistor that provides a substantially linear resistance, comprising:

receiving a selection signal at the selectable resistor;

if the selection signal is asserted, activating a diode-connected transistor and a current-source-connected transistor, wherein the current-source-connected transistor is coupled in parallel with the diode-connected transistor so that a nonlinear resistance of the diode-connected transistor combines with a nonlinear resistance of the current-source-connected transistor to produce a substantially linear combined resistance;

coupling a fixed linear resistance in parallel with the diode-connected transistor and the current-source-connected transistor;

wherein the fixed linear resistance includes,
a second diode-connected transistor, and
a second current-source-connected transistor coupled in parallel with the second diode-connected transistor; and wherein the fixed linear resistance is not selectable.

21. The method of claim 20, wherein activating the diode-connected transistor involves coupling the gate of the diode-connected transistor to the source of the diode-connected transistor.

22. The method of claim 20, wherein activating the current-source-connected transistor involves coupling the gate of the current-source-connected transistor to a current source reference voltage.

23. The method of claim 20,
wherein the diode-connected transistor is an NMOS transistor with a source input coupled to ground; and
wherein the current-source-connected transistor is an NMOS transistor with a source input coupled to ground.

24. The method of claim 23, wherein deactivating the diode-connected transistor involves coupling the gate of the diode-connected transistor to ground;

wherein deactivating the current-source-connected transistor involves coupling the gate of the current-source-connected transistor to ground.

25. The method of claim 20,
wherein the diode-connected transistor is a PMOS transistor with a source input coupled to $V_{DD}$; and
wherein the current-source-connected transistor is a PMOS transistor with a source input coupled to $V_{DD}$.

26. The method of claim 25,
wherein deactivating the diode-connected transistor involves coupling the gate of the diode-connected transistor to $V_{DD}$; and
wherein deactivating the current-source-connected transistor involves coupling the gate of the current-source-connected transistor to $V_{DD}$.

27. A method for driving a signal in a manner that provides a substantially linear resistance, comprising:

receiving an input signal;

if the input signal exceeds a threshold voltage, pulling an output up to $V_{DD}$ by activating a pullup circuit, wherein the pullup circuit includes,
a diode-connected PMOS transistor, and
a current-source-connected PMOS transistor coupled in parallel with the diode-connected PMOS transistor so that a nonlinear resistance of the diode-connected PMOS transistor combines with a nonlinear resistance of the current-source-connected PMOS transistor to produce a substantially linear combined resistance;

if the input signal falls below a threshold voltage, pulling the output down to ground by activating a pulldown circuit, wherein the pulldown circuit includes,
a diode-connected NMOS transistor, and
a current-source-connected NMOS transistor coupled in parallel with the diode-connected NMOS transistor so that a nonlinear resistance of the diode-connected NMOS transistor combines with a nonlinear resistance of the current-source-connected NMOS transistor to produce a substantially linear combined resistance; and wherein a fixed linear resistance is coupled in parallel with the pullup circuit and the pulldown circuit;

wherein the fixed linear resistance is not affected by the selection circuit.

28. The method of claim 27, further comprising:

enabling the pullup circuit when a pullup select signal is asserted; and enabling the pulldown circuit when a pulldown select signal is asserted.

29. A method for driving a signal in a manner that provides a substantially linear resistance, comprising:

receiving an input signal;

if the input signal exceeds a threshold voltage, pulling an output up to $V_{DD}$ by activating a number of selectable pullup circuits, wherein each selectable pullup circuit includes,
a diode-connected PMOS transistor, and
a current-source-connected PMOS transistor coupled in parallel with the diode-connected PMOS transistor so that a nonlinear resistance of the diode-connected PMOS transistor combines with a nonlinear resistance of the current-source-connected PMOS transistor to produce a substantially linear combined resistance; and if the input signal falls below a threshold voltage, pulling the output down to ground by activating a number of selectable pulldown circuits, wherein each selectable pulldown circuit includes,
a diode-connected NMOS transistor, and
a current-source-connected NMOS transistor coupled in parallel with the diode-connected NMOS transistor so that a nonlinear resistance of the diode-connected NMOS transistor combines with a nonlinear resistance of the current-source-connected NMOS transistor to produce a substantially linear combined resistance; and wherein the selectable pulldown circuits and the selectable pullup circuits are independently selectable, so that the driver circuit can be configured to use a selectable number of pullup circuits and a selectable number of pulldown circuits.

* * * * *